(12) United States Patent
Kawai

(10) Patent No.: US 10,631,415 B2
(45) Date of Patent: Apr. 21, 2020

(54) ELECTRONIC DEVICE AND MANUFACTURING METHOD THEREOF

(71) Applicant: OMRON Corporation, Kyoto (JP)

(72) Inventor: Wakahiro Kawai, Konan (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/613,113

(22) PCT Filed: Feb. 16, 2018

(86) PCT No.: PCT/JP2018/005489
§ 371 (c)(1),
(2) Date: Nov. 12, 2019

(87) PCT Pub. No.: WO2019/026319
PCT Pub. Date: Feb. 7, 2019

(65) Prior Publication Data
US 2020/0100368 A1   Mar. 26, 2020

(30) Foreign Application Priority Data

Aug. 2, 2017   (JP) .................. 2017-149950

(51) Int. Cl.
*H05K 3/32* (2006.01)
*H05K 1/18* (2006.01)
(Continued)

(52) U.S. Cl.
CPC ......... *H05K 3/32* (2013.01); *B29C 45/14336* (2013.01); *H05K 1/18* (2013.01);
(Continued)

(58) Field of Classification Search
CPC ............. H05K 3/32; H05K 2203/1316; H05K 2201/10356; H05K 2203/1469; B29C 45/14336
(Continued)

(56) References Cited

U.S. PATENT DOCUMENTS

2008/0067637 A1* 3/2008 Voutilainen .......... H05K 1/0243
257/664
2011/0296678 A1   12/2011 Russell
(Continued)

FOREIGN PATENT DOCUMENTS

CN   104472024   3/2015
JP   2006093378   4/2006
(Continued)

OTHER PUBLICATIONS

"International Search Report (Form PCT/ISA/210) of PCT/JP2018/005489," dated May 15, 2018, with English translation thereof, pp. 1-5.
(Continued)

*Primary Examiner* — Sherman Ng
(74) *Attorney, Agent, or Firm* — JCIPRNET

(57) ABSTRACT

This electronic device is provided with: a resin molding; and a conductive cable including an electric wire. One end portion of the conductive cable is embedded in the resin molding. The surface of the resin molding exposes an end surface on the side of the one end portion of the conductive cable and includes a surface which is continuous to the end surface. The electronic device is further provided with wirings formed on the end surface and the surface so as to be connected to the electric wire in the end surface.

18 Claims, 10 Drawing Sheets

(51) Int. Cl.
*B29C 45/14* (2006.01)
*B29L 31/34* (2006.01)

(52) U.S. Cl.
CPC ............ *B29L 2031/3425* (2013.01); *H05K 2201/10356* (2013.01); *H05K 2203/1316* (2013.01); *H05K 2203/1469* (2013.01)

(58) Field of Classification Search
USPC .......................................................... 174/251
See application file for complete search history.

(56) References Cited

U.S. PATENT DOCUMENTS

| | | | |
|---|---|---|---|
| 2014/0098505 A1 | 4/2014 | Baker | |
| 2014/0165393 A1* | 6/2014 | Sato | H01R 4/70 |
| | | | 29/858 |
| 2014/0321818 A1* | 10/2014 | Arao | G02B 6/428 |
| | | | 385/89 |
| 2016/0254615 A1* | 9/2016 | Sugita | H01R 13/5845 |
| | | | 439/606 |
| 2017/0324235 A1* | 11/2017 | Tachi | H01B 7/282 |

FOREIGN PATENT DOCUMENTS

| | | |
|---|---|---|
| JP | 2009295945 | 12/2009 |
| JP | 2010272756 | 12/2010 |
| JP | 2013207141 | 10/2013 |
| TW | 200830962 | 7/2008 |

OTHER PUBLICATIONS

"Written Opinion (Form PCT/ISA/237) of PCT/JP2018/005489", dated May 15, 2018, with English translation thereof, pp. 1-8.
"Office Action of Taiwan Counterpart Application", with English translation thereof, dated Aug. 27, 2018, p. 1-p. 10.

* cited by examiner

ELECTRONIC DEVICE AND MANUFACTURING METHOD THEREOF

CROSS-REFERENCE TO RELATED APPLICATION

This application is a 371 application of an international PCT application serial no. PCT/JP2018/005489, filed on Feb. 16, 2018, which claims the priority benefit of Japan application JP2017-149950, filed on Aug. 2, 2017. The entirety of the above-mentioned patent application is hereby incorporated by reference herein and made a part of this specification.

TECHNICAL FIELD

The present technology relates to an electronic device in which a conductive cable and a wiring are electrically connected, and a manufacturing method thereof.

BACKGROUND ART

A conductive cable that electrically connects different substrates is electrically connected to wirings on each substrate. As a connection structure between a conductive cable and wirings on a substrate, a structure using a connector disclosed in Japanese Patent Laid-Open No. 2006-93378 (Patent Document 1) is known.

FIG. 12 is a diagram showing an example of a conventional connection structure between a conductive cable and wirings on a substrate. FIG. 13 is a diagram showing another example of a conventional connection structure between a conductive cable and wirings on a substrate. In the examples shown in FIGS. 12 and 13, wirings 140 on a substrate 110 on which an electronic component 121 is mounted and a conductive cable 131 are electrically connected to each other.

In the example shown in FIG. 12, a plurality of electric wires 142 included in the conductive cable 131 are divided separately, and each electric wire 142 and wiring 140 are electrically connected by solders 141.

In the example shown in FIG. 13, a connector housing 136 is mounted on the substrate 110 in advance. The connector housing 136 is electrically connected to the wirings 140 by solders 141. Connector terminals are attached to one end portion of the conductive cable 131 and are electrically connected to electric wires in the conductive cable 131. The connector terminals are inserted into the connector housing 136, thereby electrically connecting the conductive cable 131 and the wirings 140.

CITATION LIST

Patent Literature

[Patent Document 1]
Japanese Patent Laid-Open No. 2006-93378

SUMMARY OF INVENTION

Technical Problem

However, in the connection structure shown in FIG. 12, it is required to pull out the electric wires 142 from the conductive cable 131, fix the electric wires 142 while positioning them on the substrate 110, and solder the electric wires 142 to the wirings 140. For this reason, the machining process becomes complicated and the manufacturing cost increases. Further, a space for disposing a fixing component 135 for fixing the conductive cable 131 on the substrate 110 and a space for connecting the electric wires 142 to the wirings 140 are required.

Also in the connection structure shown in FIG. 13, an operation of attaching the connector terminals electrically connected to the electric wires 142 to the one end portion of the conductive cable 131 and an operation of soldering the connector housing 136 to the wirings 140 are required, which results in an increase in manufacturing cost. Further, a space for disposing the connector housing 136 on the substrate 110 is required.

The present disclosure has been made in view of the problems described above, and it is an object of the present disclosure to provide an electronic device that inhibits an increase in manufacturing cost and requires a small space for connection between a conductive cable and wirings, and a manufacturing method thereof.

Solution to Problem

According to a certain aspect, an electronic device includes a resin molding and a conductive cable including a conductor. One end portion of the conductive cable is embedded in the resin molding. A surface of the resin molding exposes an end surface on the one end portion side of the conductive cable and includes a continuous surface which is continuous with the end surface. The electronic device further includes a wiring formed on the end surface and the continuous surface to be connected to the conductor in the end surface.

The conductive cable preferably includes a plurality of electric wires as the conductor. The wiring is connected to at least one of the plurality of electric wires exposed on the end surface.

Alternatively, the conductive cable may include an insulating substrate, a conductive circuit formed on a surface of the insulating substrate as the conductor, and an insulating layer covering the conductive circuit.

The electronic device preferably further includes an electronic component embedded in the resin molding. An electrode of the electronic component is exposed from the continuous surface. The wiring is connected to the electrode.

The electronic device preferably further includes a resist formed on the continuous surface and the end surface to cover the wiring.

According to another aspect, a manufacturing method of an electronic device includes processes of: attaching a sheet to an end surface on one end portion side of a conductive cable including a conductor; disposing the one end portion of the conductive cable and the sheet in an internal space of a mold; molding a resin molding in which the one end portion of the conductive cable is embedded by injecting a resin into the internal space; exposing the end surface of the conductive cable to a surface of the resin molding by peeling off the sheet from the resin molding; and forming a wiring connected to the conductor in the end surface of the conductive cable on the surface of the resin molding.

The manufacturing method of the electronic device preferably further includes a process of supporting the conductive cable by a supporting body so that the one end portion protrudes from the supporting body. In the process of attaching, the sheet is attached to the end surface of the conductive cable supported by the supporting body. In the process of disposing, the sheet and the supporting body are disposed in the internal space such that a surface of the sheet on a side where the end surface is not attached comes into contact with an inner surface of the mold, and a surface of the supporting body opposite to a side from which the one end portion protrudes comes into contact with the inner surface of the mold.

In the process of attaching, the electronic component is preferably attached to the sheet so that an electrode of the electronic component comes into contact with the sheet. In the process of molding, the electronic component is embedded in the resin molding. In the process of exposing, the electrode is exposed on the surface of the resin molding. In the process of forming, the wiring is formed to be connected to the electrode.

According to yet another aspect, a manufacturing method of an electronic device includes processes of: disposing one end portion of a conductive cable and a sheet in an internal space of a mold so that an end surface on the one end portion side of the conductive cable including a conductor comes into contact with the sheet; molding a resin molding in which the one end portion of the conductive cable is embedded by injecting a resin into the internal space while pressing the conductive cable against the sheet; exposing the end surface on a surface of the resin molding by peeling off the sheet from the resin molding; and forming a wiring connected to the conductor in the end surface on the surface of the resin molding.

The manufacturing method of an electronic device preferably further includes, before the process of disposing, a process of attaching an electronic component to the sheet so that an electrode of the electronic component comes into contact with the sheet. In the process of molding, the electronic component is embedded in the resin molding. In the process of exposing, the electrode is exposed on the surface of the resin molding. In the process of forming, the wiring is formed to be connected to the electrode.

Advantageous Effects of Invention

According to the present disclosure, it is possible to provide the electronic device requiring a small space for connection between the conductive cable and the wiring while inhibiting an increase in manufacturing cost and the manufacturing method thereof.

DESCRIPTION OF EMBODIMENTS

Figure 1:
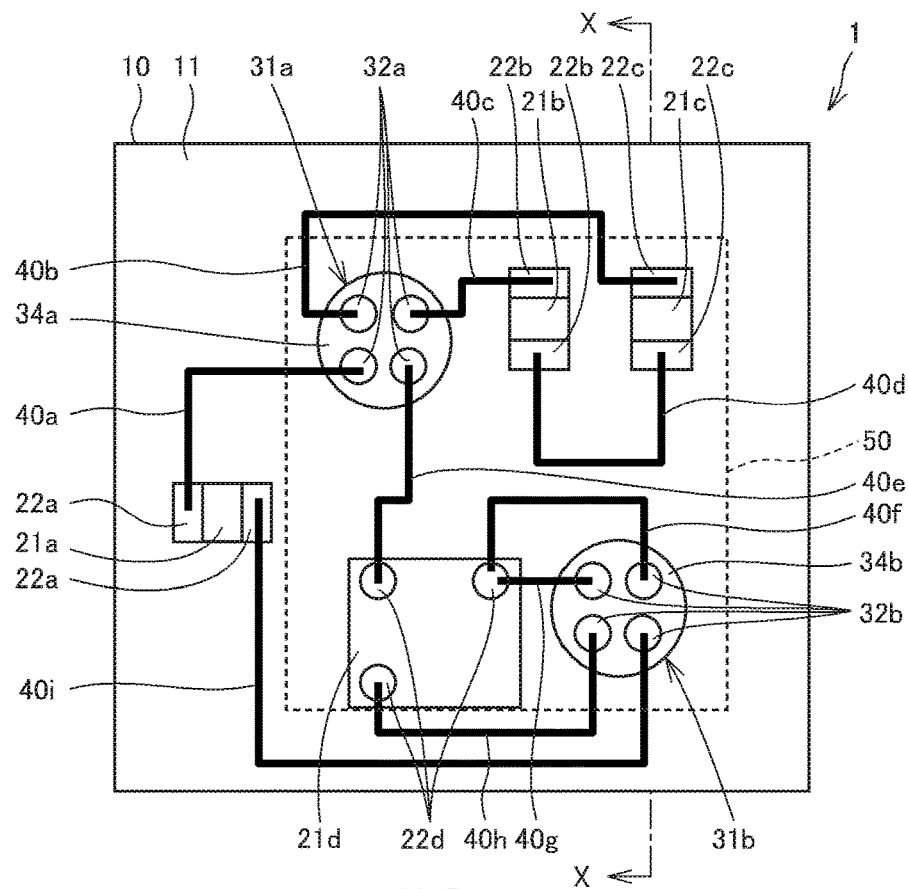
FIG. 1 is a plan view showing a schematic configuration of an electronic device according to a first embodiment.

Embodiments of the present invention will be described in detail with reference to the drawings. Also, portions the same as or corresponding to those in the drawings are denoted by the same reference signs and the description thereof will not be repeated. In addition, embodiments or modified examples which will be described below may be selectively combined as appropriate.

First Embodiment (Structure of Electronic Device)

Figure 2:
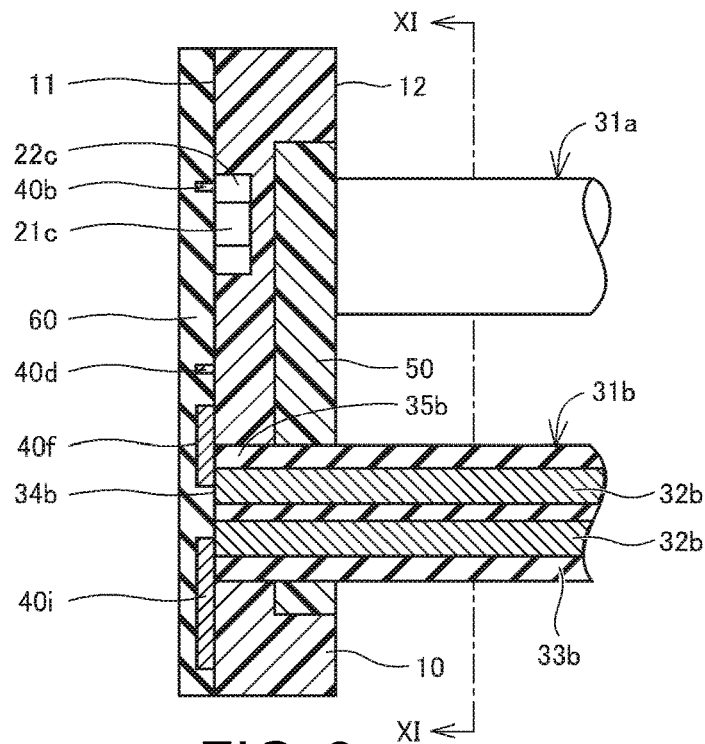
FIG. 2 is a cross-sectional view taken along line X-X of FIG. 1.
Figure 3:
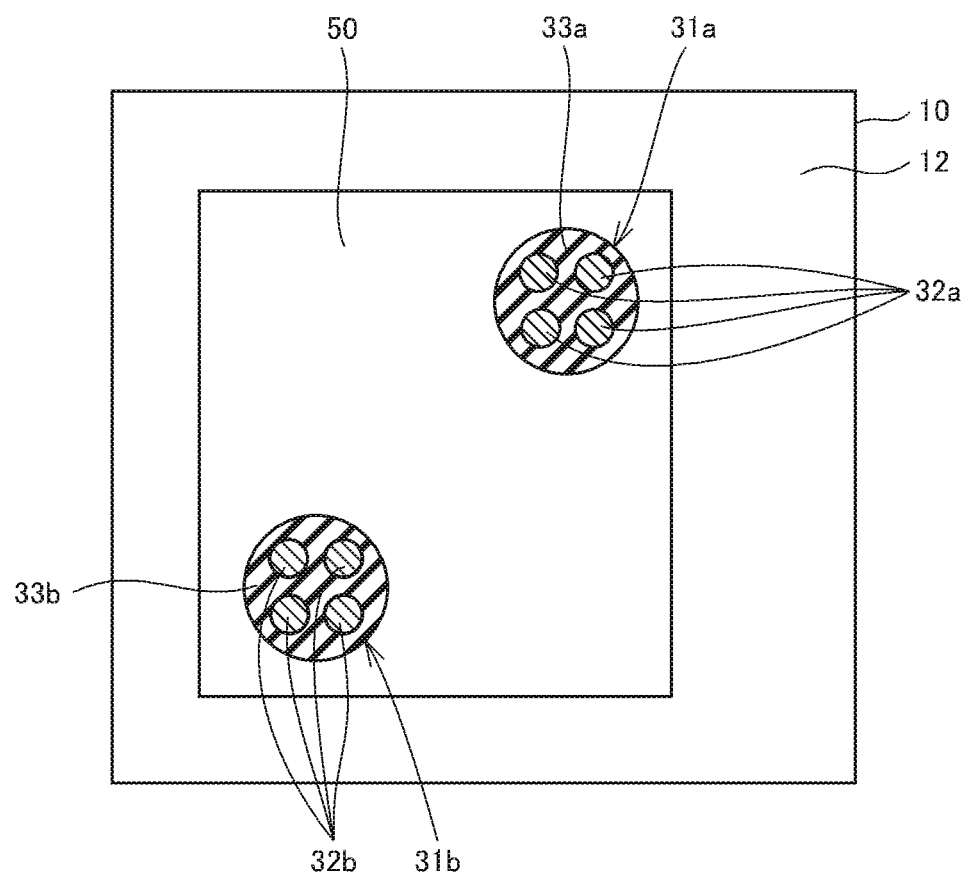
FIG. 3 is a cross-sectional view taken along line XI-XI of FIG. 2.

FIG. 1 is a plan view showing a schematic configuration of an electronic device 1 according to a first embodiment. FIG. 2 is a cross-sectional view taken along line X-X of FIG. 1. FIG. 3 is a cross-sectional view taken along line XI-XI of FIG. 2. Also, in FIG. 1, illustration of a resist 60 shown in FIG. 2 is omitted.

As shown in FIGS. 1 to 3, the electronic device 1 includes a resin molding 10, electronic components 21a to 21d, conductive cables 31a and 31b, wirings 40a to 40i, a supporting body 50, and a resist 60.

The resin molding 10 has a plate shape and is made of a resin such as polycarbonate (PC), acrylonitrile butadiene styrene (ABS), polyamide (PA), or the like. However, a material of the resin molding 10 is not particularly limited. A thickness of the resin molding 10 is not particularly limited and may be 3 mm, for example. Surfaces of the resin molding 10 include a surface 11 on which the wirings 40a to 40i are formed and a surface 12 on a back side of the surface 11.

The electronic components 21a to 21d are components selected from passive components (resistors, capacitors, etc.), active components (large-scale integrations (LSIs), integrated circuits (ICs), etc.), power supply devices (batteries, etc.), display devices (light emitting diodes (LEDs), etc.), sensors, switches, or the like. Here, the electronic components 21a to 21c are chip-type capacitors, inductors or resistors, and the electronic component 21d is an IC. However, types of the electronic components 21a to 21d are not particularly limited.

The electronic components 21a to 21d have electrodes 22a to 22d, respectively. Hereinafter, when the electronic components 21a to 21d are not particularly distinguished, each of the electronic components 21a to 21d is referred to as an "electronic component 21." Further, when the electrodes 22a to 22d are not particularly distinguished, each of the electrodes 22a to 22d is referred to as an "electrode 22."

The electronic component 21 is embedded in the resin molding 10 such that the electrode 22 is exposed from the surface 11 of the resin molding 10. In other words, the electrode 22 is formed on a surface of the electronic component 21 that is exposed from the resin molding 10. The surface exposed from the resin molding 10 among surfaces of the electronic component 21 is continuous with the surface 11 of the resin molding 10. Here, the expression that two surfaces are "continuous" with each other means that a level difference between the two surfaces is so small that a wiring formed thereon is not cut.

The conductive cable 31a includes four electric wires (conductive wires) 32a as conductors and an insulator 33a (see FIG. 3) covering the electric wires 32a. Similarly, the conductive cable 31b includes four electric wires (conductive wires) 32b and an insulator 33b (see FIGS. 2 and 3) covering the electric wires 32b. The electric wires 32a and 32b are, for example, annealed copper stranded wires having a diameter of about 0.4 mm. The insulators 33a and 33b are made of an insulating resin such as polyvinyl chloride (PVC). In addition, the number of electric wires 32a included in the conductive cable 31a is not limited thereto and may be 1 to 3 or 5 or more. Similarly, the number of electric wires 32a included in the conductive cable 31a is not limited thereto and may be 1 to 3 or 5 or more. The electric wires 32a and 32b may be single wires. Hereinafter, when the conductive cables 31a and 31b are not particularly distinguished, each of the conductive cables 31a and 31b is referred to as a "conductive cable 31." When the electric wires 32a and 32b are not particularly distinguished, each of the electric wires 32a and 32b is referred to as an "electric wire 32." When the insulators 33a and 33b are not particularly distinguished, each of the insulators 33a and 33b is referred to as an "insulator 33."

One end portion 35b (see FIG. 2) of the conductive cable 31b is embedded in the resin molding 10. However, an end surface 34b (see FIGS. 1 and 2) on the one end portion 35b side of the conductive cable 31b is exposed from the surface 11 of the resin molding 10. Although not shown in FIGS. 1 to 3, one end portion of the conductive cable 31a is also embedded in the resin molding 10 in the same manner as the conductive cable 31b. An end surface 34a (see FIG. 1) on the one end portion side of the conductive cable 31a is also exposed from the surface 11 of the resin molding 10. The surface 11 of the resin molding 10 is continuous with the end surfaces 34a and 34b.

Portions other than the one end portions of the conductive cables 31a and 31b protrude from the surface 12 of the resin molding 10. Hereinafter, when the one end portion of the conductive cable 31a and the one end portion 35b of the conductive cable 31b are not particularly distinguished, each of the one end portions of the conductive cables 31a and 31b is referred to as "one end portion 35." When the end surfaces 34a and 34b are not particularly distinguished, each of the end surfaces 34a and 34b is referred to as an "end surface 34."

The supporting body 50 supports the conductive cables 31a and 31b. The supporting body 50 supports the conductive cables 31a and 31b by surrounding outer circumferences of the conductive cables 31a and 31b. The supporting body 50 is made of a resin. The resin constituting the supporting body 50 may be the same as or different from the resin constituting the resin molding 10.

The wirings 40a to 40i are formed on at least one of the end surface 34 and the surface 11 of the resin molding 10 and are electrically connected to at least one of the electrode 22 of the electronic component 21 and the conductive cable 31. Specifically, the wiring 40a is connected to the electrode 22a of the electronic component 21a and the electric wire 32a of the conductive cable 31a. The wiring 40b is connected to the electrode 22c of the electronic component 21c and the electric wire 32a of the conductive cable 31a. The wiring 40c is connected to the electrode 22b of the electronic component 21b and the electric wire 32a of the conductive cable 31a. The wiring 40d is connected to the electrode 22b of the electronic component 21b and the electrode 22c of the electronic component 21c. The wiring 40e is connected to the electrode 22d of the electronic component 21d and the electric wire 32a of the conductive cable 31a. The wirings 40f, 40g, and 40h are connected to the electrodes 22d of the electronic component 21d and the electric wire 32b of the conductive cable 31b. The wiring 40i is connected to the electrode 22a of the electronic component 21a and the electric wire 32b of the conductive cable 31b. Hereinafter, when the wirings 40a to 40i are not particularly distinguished, each of the wirings 40a to 40i is referred to as a "wiring 40." Also, each of the wirings 40a to 40c and 40e to 40i is connected to one electric wire 32 of the conductive cable 31, but they may be connected to a plurality of electric wires 32. For example, the wiring 40 may be connected to two electric wires 32 of the conductive cable 31a and may be connected to one electric wire 32a of the conductive cable 31a and one electric wire 32b of the conductive cable 31b.

The wiring 40 can be easily formed by applying conductive liquid ink (for example, silver (Ag) nano ink) to the surface 11 of the resin molding 10 using, for example, an ink jet printing method or a screen printing method. The ink jet printing method is a printing method in which ink is deposited on an injection target surface by injecting liquid ink from nozzles. The wiring 40 may be made of a material other than Ag, or may be formed using another method, and the width, thickness and the like thereof are not particularly limited.

The resist 60 is formed on the surface 11 of the resin molding 10, the end surface 34 of the conductive cable 31 and an exposed surface of the electronic component 21 to cover the wiring 40. The resist 60 is made of an insulating material and imparts moisture resistance and insulation to the wiring 40. The resist 60 is formed by, for example, an ink jet printing method.

As described above, an electronic circuit configured of the electronic component 21 and the wiring 40 is formed on the surface 11 of the resin molding 10. The electronic circuit is connected to another electronic circuit by the conductive cable 31.

(Manufacturing Method of Electronic Device)

Figure 4:
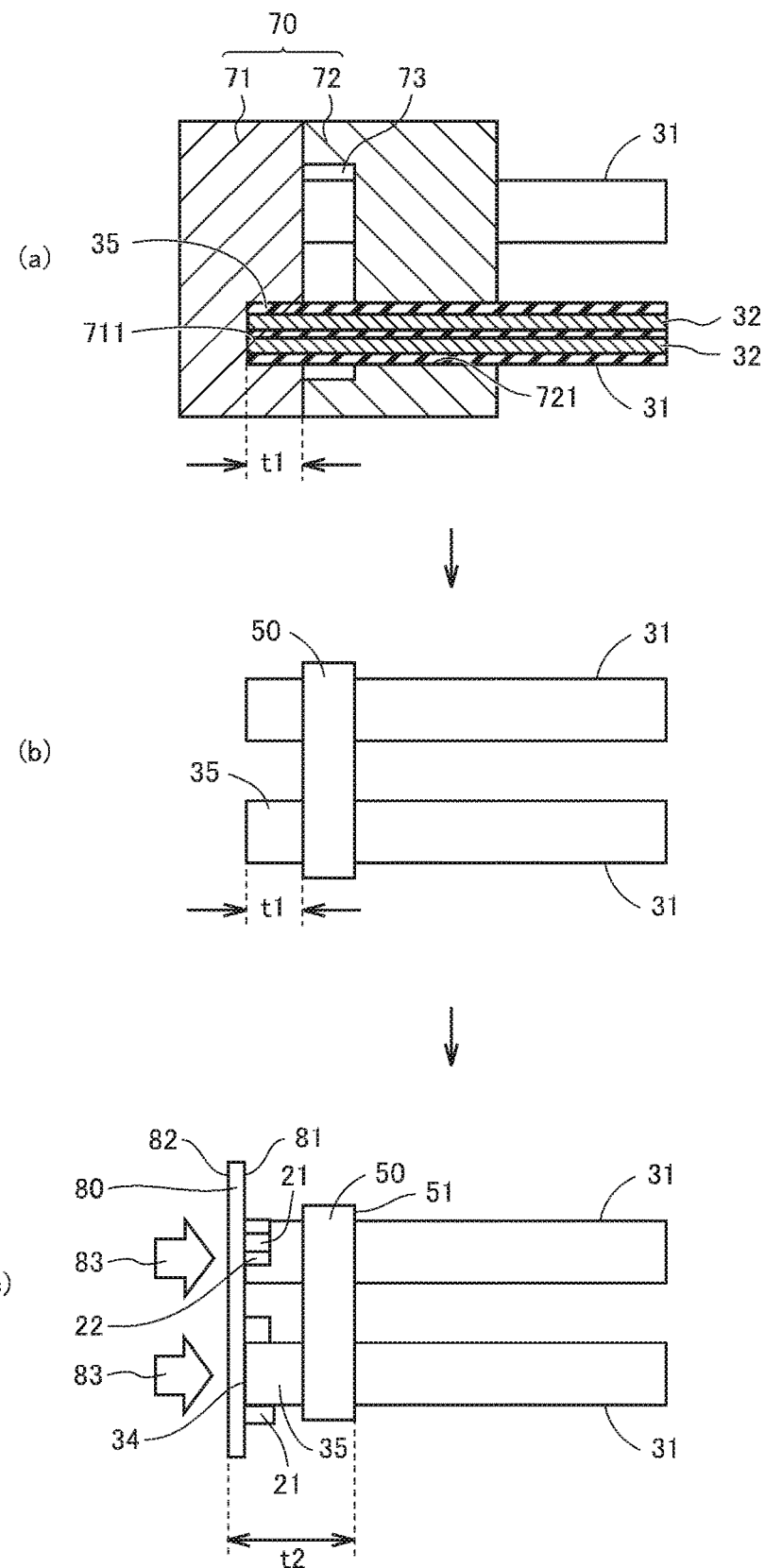
FIG. 4 is a diagram illustrating processes up to a process of attaching in a manufacturing method of the electronic device 1 according to the first embodiment.
Figure 5:
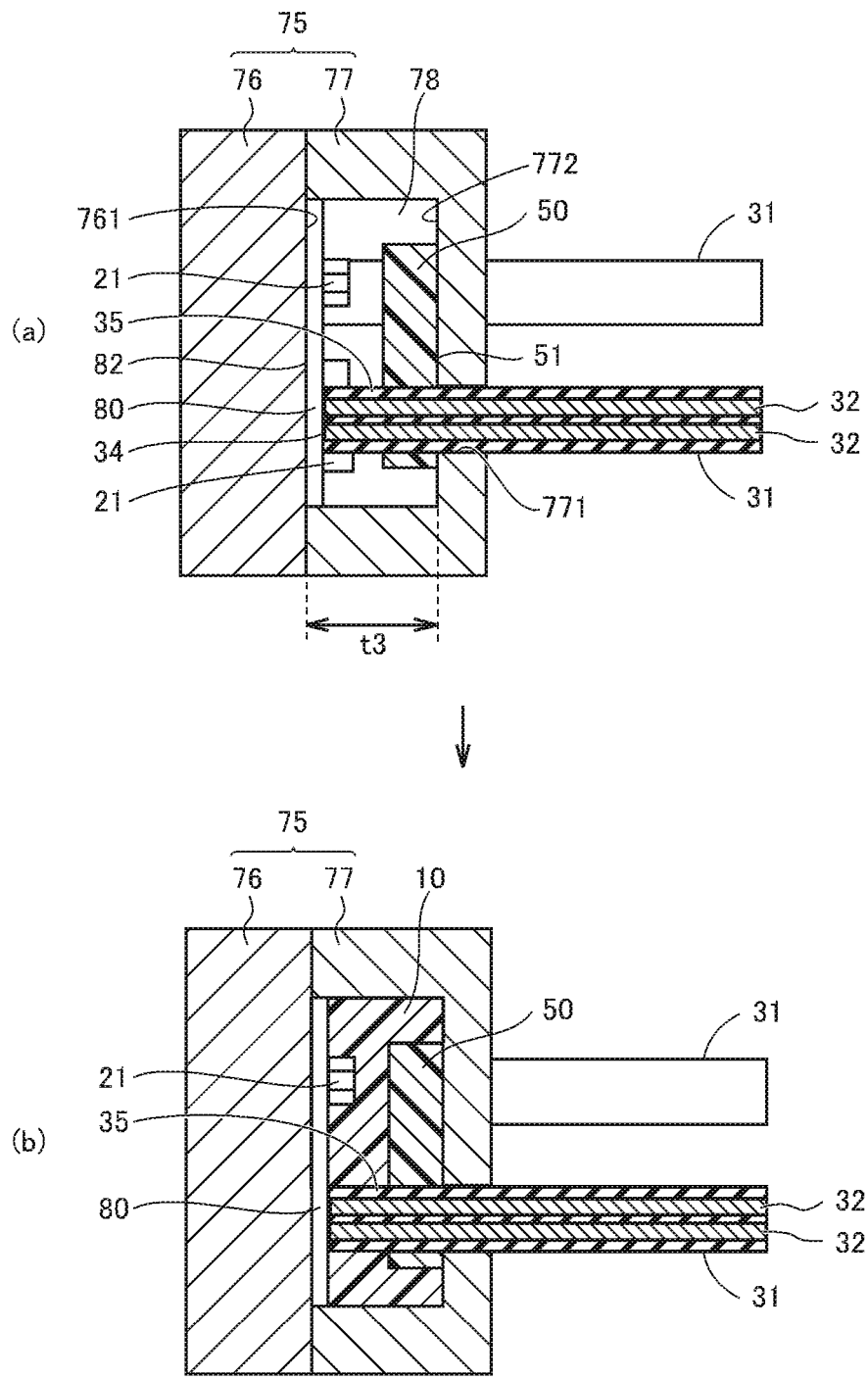
FIG. 5 is a diagram illustrating processes up to a process of exposing an end surface among processes after the process shown in FIG. 4.
Figure 6:
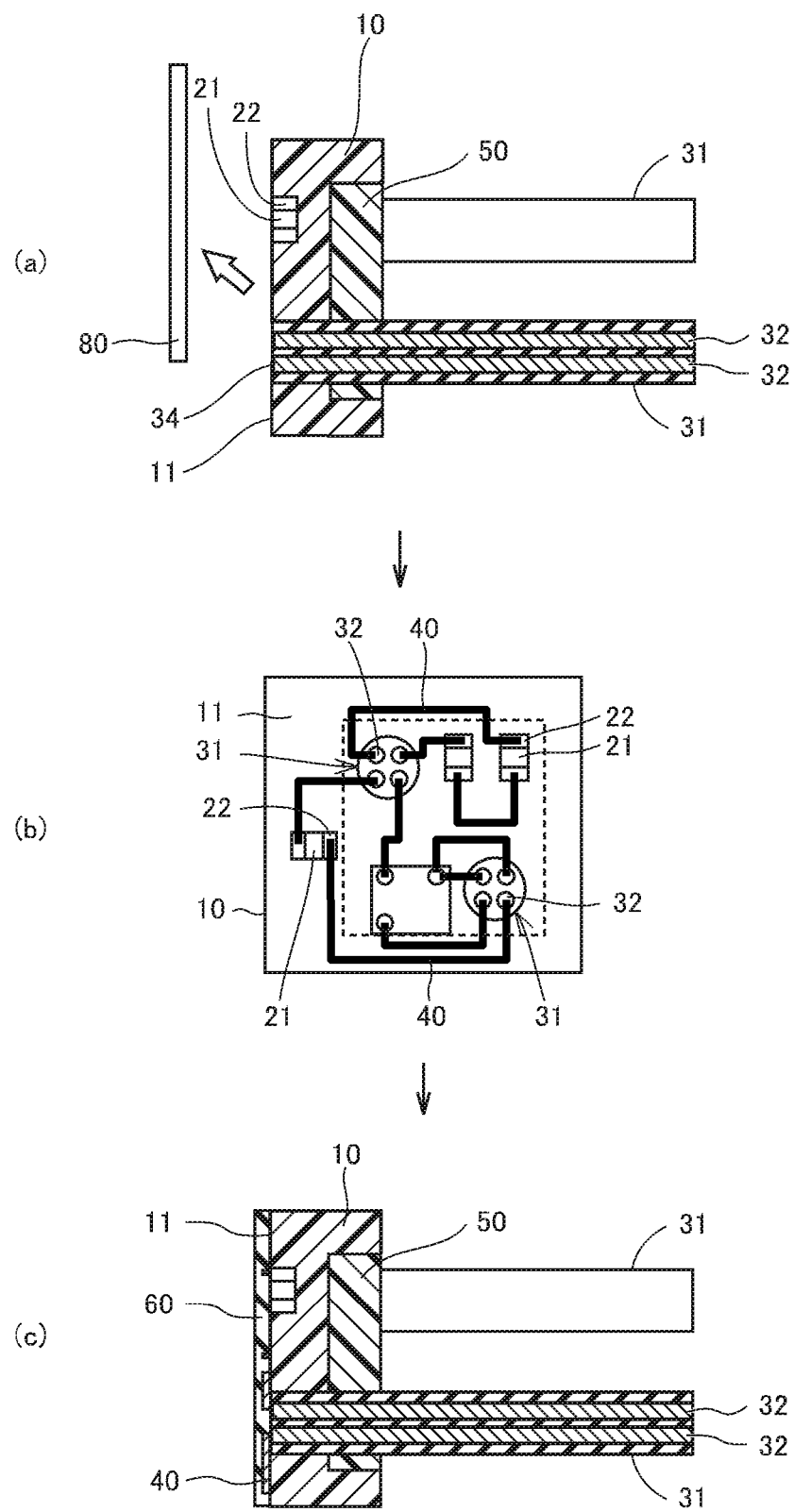
FIG. 6 is a diagram illustrating processes after the process shown in FIG. 5.

Next, a manufacturing method of the electronic device 1 will be described with reference to FIGS. 4 to 6. FIG. 4 is a diagram illustrating processes up to a process of attaching in the manufacturing method of the electronic device 1 according to the first embodiment. FIG. 5 is a diagram illustrating processes up to a process of exposing the end surface among processes after the process shown in FIG. 4. FIG. 6 is a diagram illustrating processes after the process shown in FIG. 5. (a) of FIG. 4, (a) and (b) of FIG. 5, and (a) and (c) of FIG. 6 are cross-sectional views illustrating each process of the manufacturing method of the electronic device 1. (b) and (c) of FIG. 4 are side views illustrating each process of the manufacturing method of the electronic device 1. (b) of FIG. 6 is a plan view illustrating one process of the manufacturing method of the electronic device 1.

(First Disposing Process)

As shown in (a) of FIG. 4, the conductive cable 31 is inserted into a mold 70. The mold 70 is configured of a first mold 71 and a second mold 72. A recessed portion 711 having a depth t1 into which the one end portion 35 of the conductive cable 31 is inserted is formed in the first mold 71. A through hole 721 for allowing the conductive cable 31 to pass therethrough is formed in the second mold 72. An internal space 73 is formed between the first mold 71 and the second mold 72. The conductive cable 31 is inserted through the through hole 721 of the second mold 72 until it abuts a bottom of the recessed portion 711 of the first mold 71.

(Cable Supporting Process)

Next, the supporting body 50 is molded by injecting a molten resin into the internal space 73. The resin is filled in the internal space 73 to surround the outer circumference of the conductive cable 31. For this reason, as shown in (b) of FIG. 4, a portion of the conductive cable 31 is embedded in the supporting body 50. Thus, the conductive cable 31 is supported by the supporting body 50.

Conditions for injection molding of the resin are appropriately selected in accordance with the material of the resin, and for example, when polycarbonate (PC) is used, an injection resin temperature is 270° C. and an injection pressure is 100 MPa. The resin for injection molding is appropriately selected from various resin materials.

The one end portion 35 of the conductive cable 31 protrudes from the supporting body 50 because it is inserted into the recessed portion 711 of the first mold 71. A protruding length from the supporting body 50 is t1 which is the same as the depth of the recessed portion 711 of the first mold 71.

(Attaching Process)

Next, as shown in (c) of FIG. 4, a sheet 80 is attached to the end surface 34 on the one end portion 35 side of the conductive cable 31 with an adhesive (not shown). Further, the electronic component 21 is also attached to the sheet 80 so that the electrode 22 comes into contact with the sheet 80.

For the material of the sheet 80, for example, polyethylene terephthalate (PET), polyethylene naphthalate (PEN), polyphenylene sulfide (PPS), or the like can be used. The sheet 80 is preferably made of a material that transmits ultraviolet rays and has flexibility.

Attachment of the conductive cable 31 and the electronic component 21 to the sheet 80 can be performed using, for example, an ultraviolet curable adhesive (not shown) applied to the sheet 80. For example, the ultraviolet curable adhesive is applied to one surface 81 of a PET sheet 80 with a thickness of 2 to 3 µm. This application may be performed using a method such as an ink jet printing method. Thereafter, the electronic component 21 and the conductive cable 31 are placed at predetermined positions. At this time, since the plurality of conductive cables 31 are integrated by the supporting body 50, the plurality of conductive cables 31 are easily positioned. By radiating ultraviolet rays 83 having an intensity of, for example, 3000 mJ/cm$^2$ from the other surface 82 of the sheet 80 (that is, a surface where the electronic component 21 and the conductive cable 31 are not placed), the adhesive is cured, and thus the electronic component 21 and the end surface 34 of the conductive cable 31 are attached to the sheet 80. At this time, a distance between the surface 82 of the sheet 80 and a surface 51 of the supporting body 50 opposite to the sheet 80 is set to be t2.

(Second Disposing Process)

Next, as shown in (a) of FIG. 5, the sheet 80, the one end portion 35 of the conductive cable 31, and the supporting body 50 are disposed in an internal space 78 of a mold 75. The mold 75 is configured of a first mold 76 and a second mold 77. A through hole 771 for allowing the conductive cable 31 to pass therethrough is formed in the second mold 77. A portion of the conductive cable 31 excluding the one end portion 35 and the portion embedded in the supporting body 50 is drawn out of the mold 75 through the through hole 771.

A surface 761 of the first mold 76 and a surface 772 of the second mold 77 face each other with the internal space 78 interposed therebetween. A distance t3 between the surface 761 and the surface 772 is designed to be the same as or slightly smaller than the distance t2 shown in (c) of FIG. 4. The sheet 80 and the supporting body 50 are disposed in the internal space 78 of the mold 75 such that the surface 82 of the sheet 80 comes into contact with the surface 761 of the first mold 76 and the surface 51 of the supporting body 50 comes into contact with the surface 772 of the second mold 77. Thus, the end surface 34 on the one end portion 35 side of the conductive cable 31 is unlikely to be detached from the sheet 80 even if the adhesive strength with the sheet 80 is weak.

(Resin Molding Process)

Next, the resin molding 10 is molded by injecting a molten resin into the internal space 78. The resin is filled in the internal space 78 to surround the electronic component 21, the one end portion 35 of the conductive cable 31, and the supporting body 50. For this reason, as shown in (b) of FIG. 5, the electronic component 21, the one end portion 35 of the conductive cable 31, and the supporting body 50 are embedded in the resin molding 10.

Conditions for injection molding of the resin are appropriately selected in accordance with to the material of the resin, and for example, when polycarbonate is used, an injection resin temperature is 270° C. and an injection pressure is 100 MPa. The resin for injection molding is appropriately selected from various resin materials.

(End Surface Exposing Process)

Next, as shown in (a) of FIG. 6, the sheet 80 is peeled off from the surface of the resin molding 10. The surface 11 of the resin molding 10 is a surface in contact with the sheet 80. When the sheet 80 is peeled off, the electrode 22 of the electronic component 21 and the end surface 34 of the conductive cable 31 are exposed from the surface 11. In this case, the surface 11 is continuous with the end surface 34.

(Wiring Forming Process)

Next, as shown in (b) of FIG. 6, the wiring 40 connected to at least one of the electric wire 32 of the conductive cable 31 and the electrode 22 of the electronic component 21 is formed on the surface 11 of the resin molding 10.

Formation of the wiring 40 is performed using a method (an inkjet printing method), in which a conductive material (for example, silver nano ink) is injected and printed by an ink jet printer or the like, a screen printing method, or the like.

(Resist Forming Process)

Finally, as shown in (c) of FIG. 6, the resist 60 covering the wiring 40 is formed on the surface 11 of the resin molding 10 in order to prevent the wiring 40 from being oxidized. The resist 60 of the electronic device 1 is formed by using a known technique in which an ultraviolet curable resist material is printed by an inkjet printer or the like and cured by irradiating with ultraviolet rays.

The electronic device 1 is manufactured through the above processes. In addition, when the end surface 34 of the conductive cable 31 is firmly attached to the sheet 80 in the attaching process, and the end surface 34 of the conductive cable 31 is difficult to be detached from the sheet 80 in the resin molding process, the cable supporting process may be omitted. In this case, the electronic device 1 does not include the supporting body 50.

Advantages

As described above, the electronic device 1 according to the first embodiment includes the resin molding 10 and the conductive cable 31 including the electric wire 32 that is the conductor. The one end portion 35 of the conductive cable 31 is embedded in the resin molding 10. The surface of the resin molding 10 includes the surface (continuous surface) 11 which is continuous with the end surface 34 while exposing the end surface 34 on the one end portion 35 side of the conductive cable 31. The electronic device 1 further includes the wiring 40 formed on the end surface 34 and the surface 11 to be connected to the electric wire 32 in the end surface 34.

According to the above configuration, the conductive cable 31 is fixed by the resin molding 10. For this reason, the wiring 40 connected to the electric wire 32 of the conductive cable 31 can be easily formed. That is, unlike the conventional case, no troublesome work such as fixing a conductive cable while positioning it on a substrate or the like is required. Further, unlike the conventional case, it is unnecessary to separately provide a component for fixing the conductive cable 31, and thus a space for disposing the component is not required.

Further, the wiring 40 is formed on the end surface 34 of the conductive cable 31 and the surface 11 of the resin molding 10 which is continuous with the end surface 34. Thus, separate components such as connectors are not required. Further, unlike the conventional case, a space for connecting the electric wire of the conductive cable and the wiring with a solder or the like is not required, and thus no complicated connection work such as soldering is required.

As described above, according to the electronic device 1, an increase in manufacturing cost is inhibited, and a space required for connection between the conductive cable 31 and the wiring 40 can be reduced.

The conductive cable 31 includes the plurality of electric wires 32 as the conductor. The wiring 40 is connected to at least one of the plurality of electric wires 32 exposed on the end surface 34. Even when the conductive cable 31 includes the plurality of electric wires 32, the plurality of electric wires 32 are exposed on the end surface 34. Thus, the wiring 40 connected to each of the plurality of electric wires 32 can be easily formed. That is, unlike the conventional case, no troublesome work such as pulling out a plurality of electric wires one by one from a conductive cable and connecting them to a wiring is required.

The electronic device 1 further includes the electronic component 21 embedded in the resin molding 10. The electrode 22 of the electronic component 21 is exposed from the surface 11. The wiring 40 is connected to the electrode 22. Thus, in the electronic device 1, an electronic circuit is configured of the electronic component 21 and the wiring 40. The electronic circuit can be easily connected to another electronic device by the conductive cable 31.

The electronic device 1 further includes the resist 60 formed on the surface 11 and the end surface 34 to cover the wiring 40. As described above, the surface 11 is continuous with the end surface 34. For this reason, the resist 60 that covers the wiring 40 can be easily formed.

Further, the manufacturing method of the electronic device 1 may include at least the following processes.

The process of attaching the sheet 80 to the end surface 34 on the one end portion 35 side of the conductive cable 31 including the electric wire 32 that is the conductor (attaching process).

The process of disposing the one end portion 35 of the conductive cable 31 and the sheet 80 in the internal space 78 of the mold 75 (second disposing process).

The process of molding the resin molding 10 in which the one end portion 35 of the conductive cable 31 is embedded by injecting a resin into the internal space 78 (resin molding process).

The process of exposing the end surface 34 to the surface of the resin molding 10 by peeling off the sheet 80 from the resin molding 10 (end surface exposing process).

The process of forming the wiring 40 connected to the electric wire 32 in the end surface 34 on the surface of the resin molding 10 (wiring forming process).

With the above configuration, it is possible to manufacture the electronic device 1 that inhibits an increase in manufacturing cost and reduces a space required for connection between the conductive cable 31 and the wiring 40.

The manufacturing method of the electronic device 1 further includes the process of supporting the conductive cable 31 by the supporting body 50 so that the one end portion 35 of the conductive cable 31 protrudes from the supporting body 50. In the attaching process, the sheet 80 is attached to the end surface 34 of the conductive cable 31 supported by the supporting body 50. In the second disposing process, the surface 82 of the sheet 80 to which the end surface 34 is not attached comes into contact with the surface 761 of the mold 75, and the surface 51 on the side opposite to the side from which the one end portion 35 of the supporting body 50 protrudes comes into contact with the surface 772 of the mold 75. Thus, the positions of the sheet 80 and the supporting body 50 are stabilized in the internal space 78. As a result, it is possible to inhibit the end surface 34 of the conductive cable 31 from being detached from the sheet 80 when the resin molding 10 is molded.

In the attaching process, the electronic component 21 is attached to the sheet 80 so that the electrode 22 of the electronic component 21 comes into contact with the sheet 80. In the resin molding process, the electronic component 21 is embedded in the resin molding 10. In the end surface exposing process, the electrode 22 is exposed on the surface of the resin molding 10. In the wiring forming process, the wiring 40 is formed to be connected to the electrode 22. Thus, an electronic circuit is configured of the electronic component 21 and the wiring 40, and the electronic circuit can be easily connected to another electronic device via the conductive cable 31.

Second Embodiment

In the first embodiment, the electronic device 1 including the conductive cable 31 including the electric wire 32 that is a round conductor has been described. However, a shape of the conductive cable included in the electronic device is not limited thereto. An electronic device according to a second embodiment includes a flexible flat cable including a flat conductor as the conductive cable.

Figure 7:
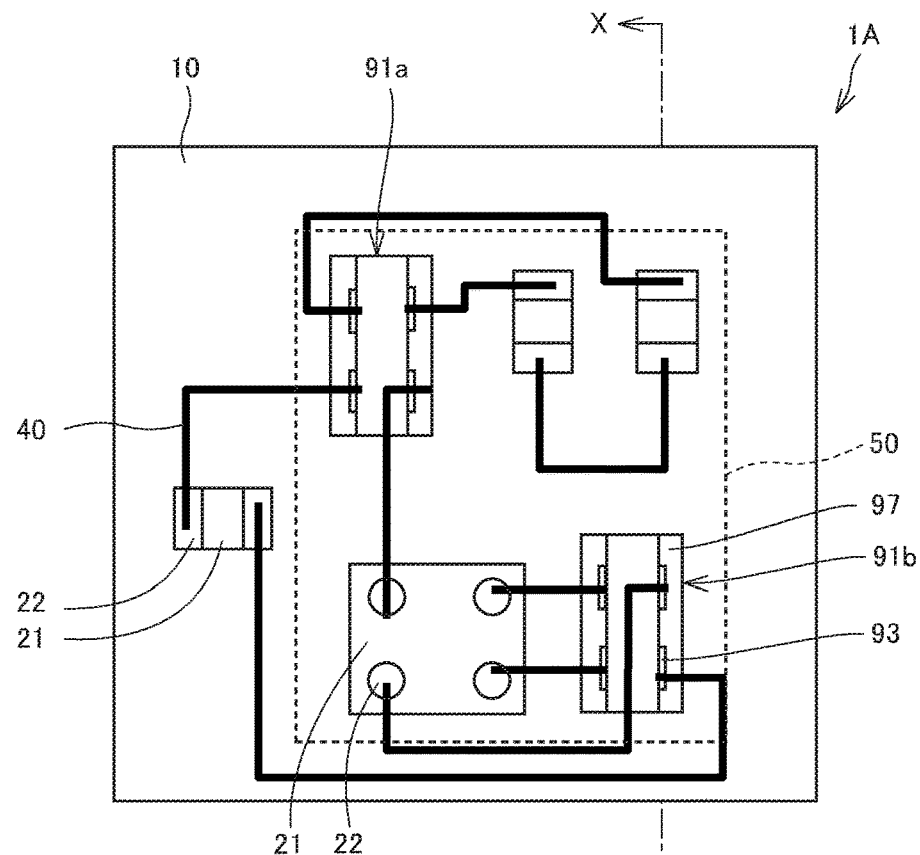
FIG. 7 is a plan view showing a schematic configuration of an electronic device according to a second embodiment.
Figure 8:
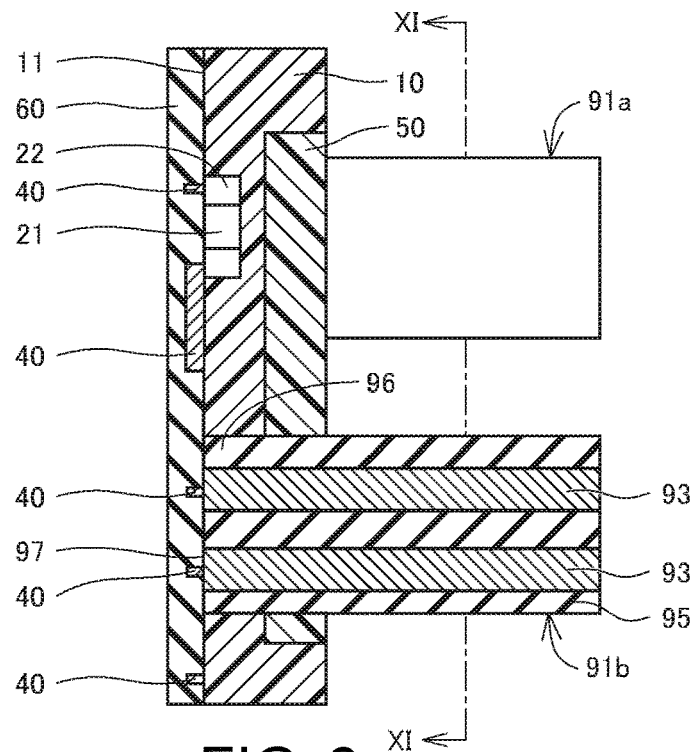
FIG. 8 is a cross-sectional view taken along line X-X of FIG. 7.
Figure 9:
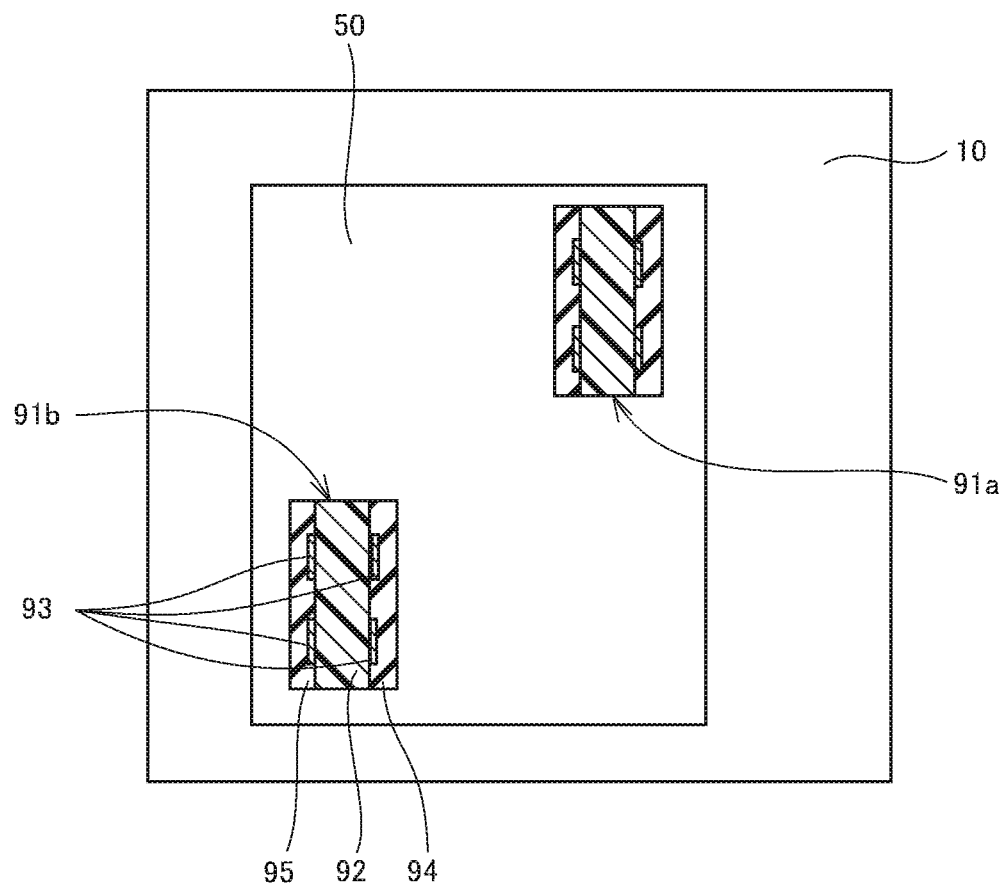
FIG. 9 is a cross-sectional view taken along line XI-XI of FIG. 8.

FIG. 7 is a plan view showing a schematic configuration of the electronic device 1A according to the second embodiment. FIG. 8 is a cross-sectional view taken along line X-X of FIG. 7. FIG. 9 is a cross-sectional view taken along line XI-XI of FIG. 8. Also, in FIG. 7, illustration of the resist 60 shown in FIG. 8 is omitted.

As shown in FIGS. 7 to 9, the electronic device 1A is different from the electronic device 1 of the first embodiment in that the electronic device 1A includes two conductive cables 91a and 91b instead of the two conductive cables 31a and 31b. The electronic device 1A according to the second embodiment is manufactured by the same manufacturing method as that of the first embodiment.

The conductive cables 91a and 91b are flexible flat cables. The conductive cables 91a and 91b include a flexible substrate 92, four conductive circuits 93, and insulating layers 94 and 95 (see FIG. 9).

The flexible substrate 92 is a strip-shaped insulating substrate having flexibility and is made of, for example, polyimide (PI). Two of the four conductive circuits 93 are formed on one surface of the flexible substrate 92 and the remaining two are formed on the other surface of the flexible substrate 92. The conductive circuits 93 are conductors having flat cross-sections and are made of, for example, copper. The four conductive circuits 93 are linearly formed in a longitudinal direction of the flexible substrate 92 and are insulated from each other. The insulating layer 94 is formed on one surface of the flexible substrate 92 to cover the conductive circuits 93. The insulating layer 95 is formed on the other surface of the flexible substrate 92 to cover the conductive circuits 93. The insulating layers 94 and 95 are made of a resin. In this way, the conductive cables 91a and 91b are multilayer boards in which the flexible substrate 92, the conductive circuits 93, and the insulating layers 94 and 95 are laminated.

One end portions 96 (see FIG. 8) of the conductive cables 91a and 91b are embedded in the resin molding 10. However, end surfaces 97 (see FIGS. 7 and 8) on the one end portions 96 side of the conductive cables 91a and 91b are exposed from the surface 11 of the resin molding 10. The surface 11 is continuous with the end surfaces 97. The wiring 40 is formed on the surface 11 to be connected to the conductive circuits 93 in the end surface 97.

The electronic device 1A according to the second embodiment has the same advantages as those of the electronic device 1 according to the first embodiment.

Third Embodiment

In the first embodiment, the surface 51 of the supporting body 50 is brought into contact with the surface 772 of the second mold 77 so that a contact state between the end surface 34 of the conductive cable 31 and the sheet 80 in the internal space 78 of the mold 75 is maintained. On the other hand, in a third embodiment, the contact state between the end surface 34 of the conductive cable 31 and the sheet 80 is maintained by applying a force F to the conductive cable 31 on the sheet 80 side. For this reason, the electronic device according to the third embodiment does not include the supporting body 50. Further, in a manufacturing method of the electronic device according to the third embodiment, the "first disposing process" and the "supporting body forming process" in the first embodiment are omitted.

Figure 10:
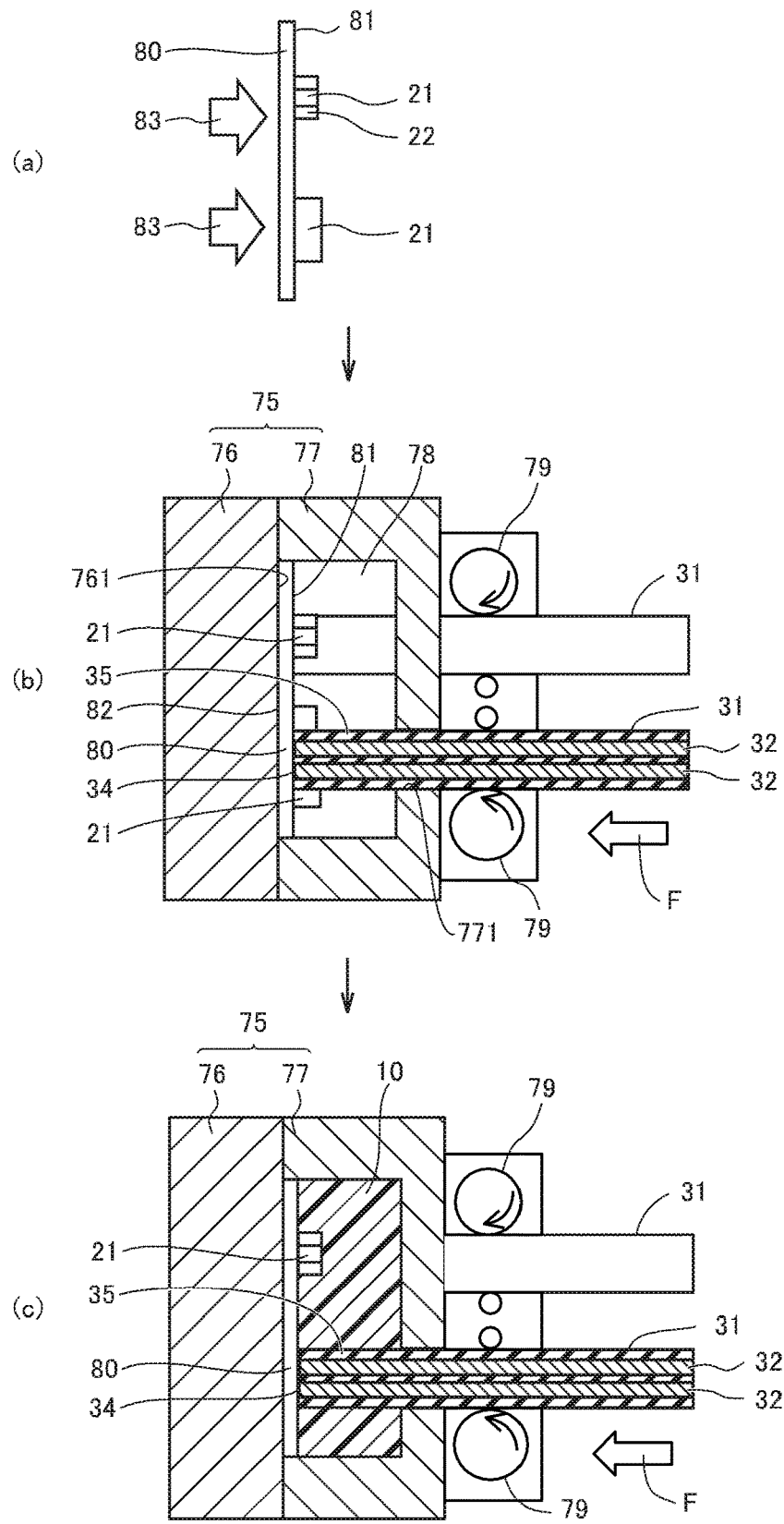
FIG. 10 is a diagram illustrating a first half of processes in a manufacturing method of an electronic device according to a third embodiment.
Figure 11:
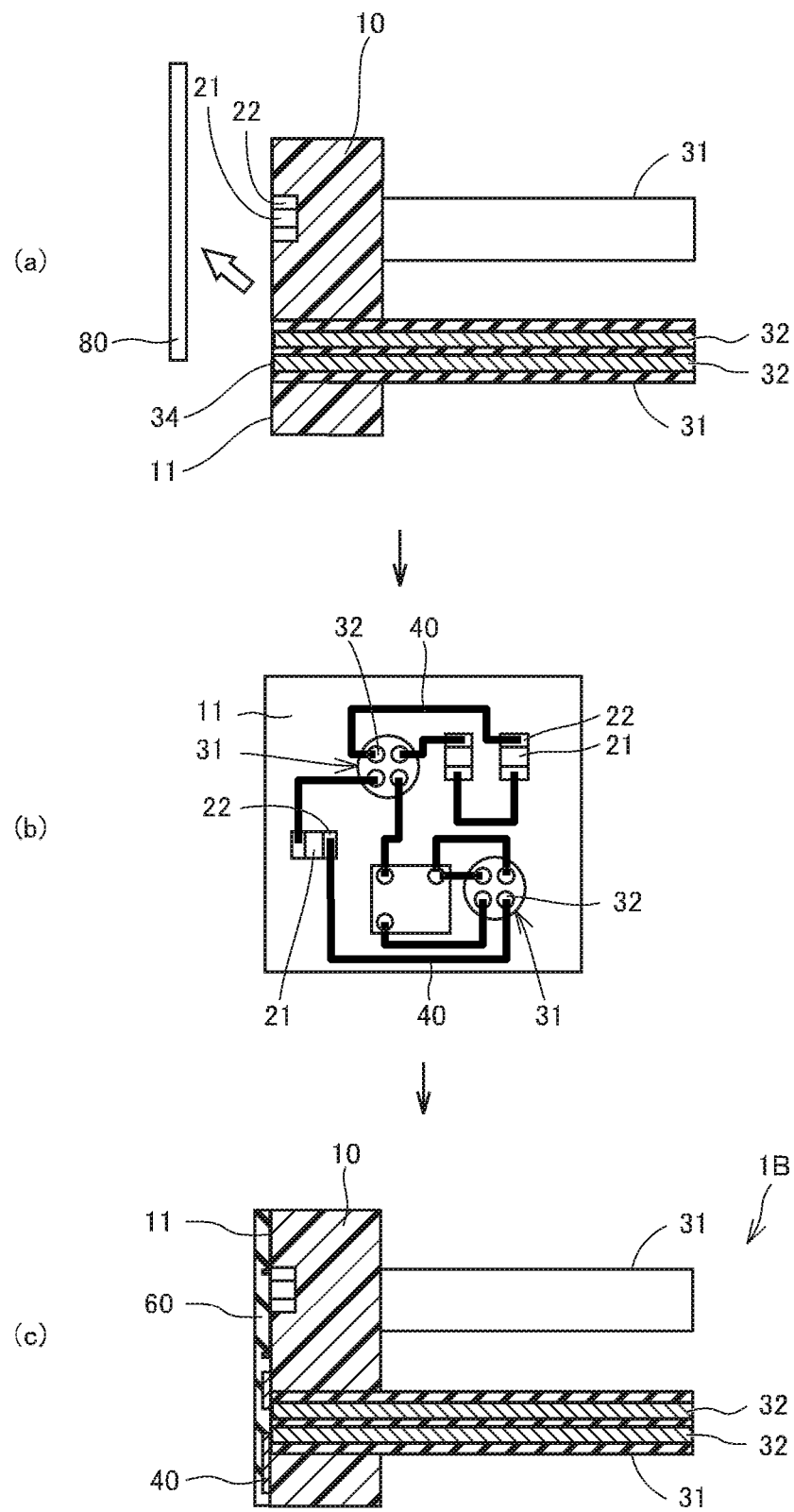
FIG. 11 is a diagram illustrating a latter half of processes in the manufacturing method of the electronic device according to the third embodiment.
Figure 12:
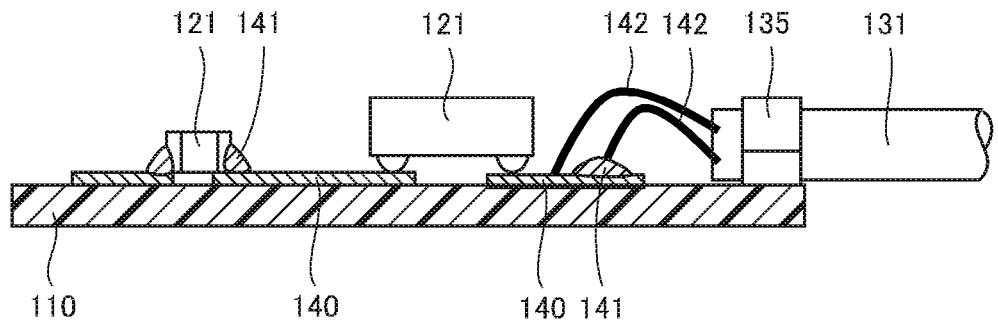
FIG. 12 is a diagram showing an example of a conventional connection structure between a conductive cable and a wiring on a substrate.
Figure 13:
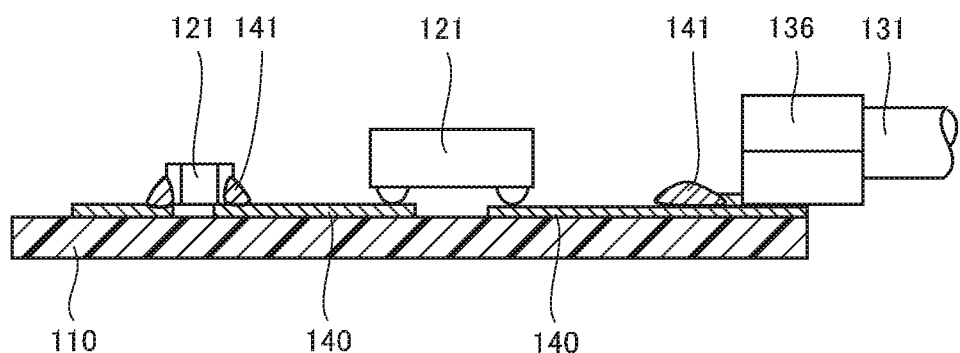
FIG. 13 is a diagram showing another example of a conventional connection structure between a conductive cable and a wiring on a substrate.

The manufacturing method of the electronic device 1B according to the third embodiment will be described with reference to FIGS. 10 and 11. FIG. 10 is a diagram illustrating a first half of processes in the manufacturing method of the electronic device 1B according to the third embodiment. FIG. 11 is a diagram illustrating a latter half of processes in the manufacturing method of the electronic device 1B according to the third embodiment. (b) and (c) of FIG. 10 and (a) and (c) of FIG. 11 are cross-sectional views illustrating respective processes in the manufacturing method of the electronic device 1. (a) of FIG. 10 shows a side view illustrating one process of the manufacturing method of the electronic device 1. (b) of FIG. 11 shows a plan view illustrating one process of the manufacturing method of the electronic device 1.

(Attaching Process)

First, as shown in (a) of FIG. 10, the electronic component 21 is attached to the sheet 80. At this time, the electrode 22 of the electronic component 21 comes into contact with the sheet 80. An attaching method of the electronic component 21 to the sheet 80 is the same as the attaching process of the first embodiment and for example, an ultraviolet curable adhesive is applied to one surface 81 of the sheet 80 and irradiated with the ultraviolet rays 83, thereby attaching the electronic component 21 to the sheet 80.

(Disposing Process)

Next, as shown in (b) of FIG. 10, the one end portion 35 of the conductive cable 31 and the sheet 80 are disposed in the internal space 78 of the mold 75 so that the end surface 34 of the conductive cable 31 comes into contact with the sheet 80. In this case, the conductive cable 31 passes through the through hole 771 of the second mold 77 and is pressed against the surface 81 of the sheet 80 using a roller 79. The roller 79 is driven by a motor (not shown) and applies a force F to the conductive cable 31 toward the sheet 80 side.

(Resin Molding Process)

Next, as shown in (c) of FIG. 10, the resin molding 10 is molded by injecting a molten resin into the internal space 78 while pressing the conductive cable 31 against the sheet 80. The resin is filled in the internal space 78 to surround the electronic component 21 and the conductive cable 31. For this reason, as shown in (c) of FIG. 10, the electronic component 21 and the one end portion 35 of the conductive cable 31 are embedded in the resin molding 10. At this time, since the conductive cable 31 is pressed against the sheet 80, it is possible to inhibit the end surface 34 of the conductive cable 31 from being detached from the sheet 80 due to a flow pressure of the molten resin.

Then, as shown in (a) to (c) of FIG. 11, a (end surface exposing process), a (wiring forming process) and a (resist forming process) the same as those in the first embodiment are performed, and the electronic device 1B including the electronic component 21, the conductive cable 31, the resin molding 10, the wiring 40, and the resist 60 is produced. Also, in the above description, the force F toward the sheet 80 is applied to the conductive cable 31 in the disposing process and the resin molding process, but the force F may be applied to the conductive cable 31 at least in the resin molding process.

As described above, the manufacturing method of the electronic device 1B includes the following processes.

The process of disposing the one end portion 35 of the conductive cable 31 and the sheet 80 in the internal space 78 of the mold 75 so that the end surface 34 on the one end portion 35 side of the conductive cable 31 including the electric wire 32 that is the conductor comes into contact with the sheet 80 (disposing process).

The process of molding the resin molding 10 in which the one end portion 35 of the conductive cable 31 is embedded by injecting a resin into the internal space 78 while pressing the conductive cable 31 against the sheet 80 (resin molding process).

The process of exposing the end surface 34 on the surface of the resin molding 10 by peeling off the sheet 80 from the resin molding 10 (end surface exposing process).

The process of forming the wiring 40 connected to the electric wire 32 in the end surface 34 on the surface of the resin molding 10 (wiring forming process).

According to the third embodiment, it is also possible to manufacture the electronic device 1B that inhibits an increase in manufacturing cost and reduces a space required for connection between the conductive cable 31 and the wiring 40. The electronic device 1B does not include the supporting body 50. For this reason, the manufacturing cost for producing the supporting body 50 can be curbed. Further, in the case of the electronic device 1 including the supporting body 50, a design of the electronic device 1 is restricted due to the supporting body 50, but the restriction is inhibited in the third embodiment.

It should be understood that the embodiments described above are examples in all aspects and are not to be considered as limiting. The scope of the present invention should be constructed not by the foregoing description, but by the scope of the appended claims, and is intended to include any modifications within the scope and meaning equivalent to those of the claims.

The invention claimed is:

1. An electronic device comprising:
a resin molding; and
a conductive cable including a conductor,
wherein one end portion of the conductive cable is embedded in the resin molding,
a surface of the resin molding exposes an end surface on the one end portion side of the conductive cable and includes a continuous surface which is continuous with the end surface, and
the electronic device further includes a wiring formed on the end surface and the continuous surface to be connected to the conductor in the end surface.

2. The electronic device according to claim 1,
wherein the conductive cable includes a plurality of electric wires as the conductor, and
the wiring is connected to at least one of the plurality of electric wires exposed on the end surface.

3. The electronic device according to claim 1, wherein the conductive cable includes an insulating substrate, a conductive circuit formed on a surface of the insulating substrate as the conductor, and an insulating layer covering the conductive circuit.

4. The electronic device according to claim 1, further comprising:
an electronic component embedded in the resin molding, wherein an electrode of the electronic component is exposed from the continuous surface, and
the wiring is connected to the electrode.

5. The electronic device according to claim 1, further comprising a resist formed on the continuous surface and the end surface to cover the wiring.

6. The electronic device according to claim 2, further comprising:
an electronic component embedded in the resin molding, wherein an electrode of the electronic component is exposed from the continuous surface, and
the wiring is connected to the electrode.

7. The electronic device according to claim 3, further comprising:
an electronic component embedded in the resin molding, wherein an electrode of the electronic component is exposed from the continuous surface, and
the wiring is connected to the electrode.

8. The electronic device according to claim 2, further comprising a resist formed on the continuous surface and the end surface to cover the wiring.

9. The electronic device according to claim 3, further comprising a resist formed on the continuous surface and the end surface to cover the wiring.

10. The electronic device according to claim 4, further comprising a resist formed on the continuous surface and the end surface to cover the wiring.

11. The electronic device according to claim 6, further comprising a resist formed on the continuous surface and the end surface to cover the wiring.

12. The electronic device according to claim 7, further comprising a resist formed on the continuous surface and the end surface to cover the wiring.

13. A manufacturing method of an electronic device comprising processes of:
attaching a sheet to an end surface on one end portion side of a conductive cable including a conductor;
disposing the one end portion of the conductive cable and the sheet in an internal space of a mold;
molding a resin molding in which the one end portion of the conductive cable is embedded by injecting a resin into the internal space;
exposing the end surface of the conductive cable to a surface of the resin molding by peeling off the sheet from the resin molding; and
forming a wiring connected to the conductor in the end surface of the conductive cable on the surface of the resin molding.

14. The manufacturing method of the electronic device according to claim 13, further comprising a process of:
supporting the conductive cable by a supporting body so that the one end portion protrudes from the supporting body,
wherein, in the process of attaching, the sheet is attached to the end surface of the conductive cable supported by the supporting body,
in the process of disposing, the sheet and the supporting body are disposed in the internal space such that a surface of the sheet on a side where the end surface is not attached comes into contact with an inner surface of the mold, and a surface of the supporting body opposite to a side from which the one end portion protrudes comes into contact with the inner surface of the mold.

15. The manufacturing method of the electronic device according to claim 13,
wherein, in the process of attaching, the electronic component is attached to the sheet so that an electrode of the electronic component comes into contact with the sheet,
in the process of molding, the electronic component is embedded in the resin molding,
in the process of exposing, the electrode is exposed on the surface of the resin molding, and
in the process of forming, the wiring is formed to be connected to the electrode.

16. The manufacturing method of the electronic device according to claim 14,
wherein, in the process of attaching, the electronic component is attached to the sheet so that an electrode of the electronic component comes into contact with the sheet,
in the process of molding, the electronic component is embedded in the resin molding,
in the process of exposing, the electrode is exposed on the surface of the resin molding, and
in the process of forming, the wiring is formed to be connected to the electrode.

17. A manufacturing method of an electronic device comprising processes of:
disposing one end portion of a conductive cable and a sheet in an internal space of a mold so that an end surface on the one end portion side of the conductive cable including a conductor comes into contact with the sheet;

molding a resin molding in which the one end portion of the conductive cable is embedded by injecting a resin into the internal space while pressing the conductive cable against the sheet;

exposing the end surface on a surface of the resin molding by peeling off the sheet from the resin molding; and forming a wiring connected to the conductor in the end surface on the surface of the resin molding.

18. The manufacturing method of the electronic device according to claim 17, further comprising a process of:

wherein, before the process of disposing, attaching an electronic component to the sheet so that an electrode of the electronic component comes into contact with the sheet, in the process of molding, the electronic component is embedded in the resin molding, in the process of exposing, the electrode is exposed on the surface of the resin molding, and in the process of forming, the wiring is formed to be connected to the electrode.

\* \* \* \* \*